(12) United States Patent
Yee et al.

(10) Patent No.: US 9,728,481 B2
(45) Date of Patent: Aug. 8, 2017

(54) SYSTEM WITH A HIGH POWER CHIP AND A LOW POWER CHIP HAVING LOW INTERCONNECT PARASITICS

(75) Inventors: Abraham F. Yee, Cupertino, CA (US); Joe Greco, San Jose, CA (US); Jun Zhai, San Jose, CA (US); Joseph Minacapelli, Sunnyvale, CA (US); John Y. Chen, Cupertino, CA (US)

(73) Assignee: NVIDIA Corporation, Santa Clara, CA (US)

( * ) Notice: Subject to any disclaimer, the term of this patent is extended or adjusted under 35 U.S.C. 154(b) by 483 days.

(21) Appl. No.: 13/227,328

(22) Filed: Sep. 7, 2011

(65) Prior Publication Data
US 2013/0058067 A1    Mar. 7, 2013

(51) Int. Cl.
*H01L 23/10* (2006.01)
*H01L 23/36* (2006.01)
(Continued)

(52) U.S. Cl.
CPC ........ *H01L 23/36* (2013.01); *H01L 23/49822* (2013.01); *H01L 23/49827* (2013.01); *H01L 23/5389* (2013.01); *H01L 25/0655* (2013.01); *H01L 25/0657* (2013.01); *H01L 25/18* (2013.01); *H01L 23/3128* (2013.01); *H01L 2224/04105* (2013.01); *H01L 2224/12105* (2013.01); *H01L 2224/16225* (2013.01);
(Continued)

(58) Field of Classification Search
CPC .............. H01L 23/36; H01L 23/49822; H01L 23/49827

USPC ................ 257/706, 686, 692, 693, E23.069, 257/E23.023; 438/109
See application file for complete search history.

(56) References Cited

U.S. PATENT DOCUMENTS 6,292,366 B1 * 9/2001 Platt .............................. 361/700
8,125,066 B1    2/2012 Kang
(Continued)

FOREIGN PATENT DOCUMENTS

| DE | 10 2007 006 191 A1 | 8/2007 |
|---|---|---|
| EP | 1951015 | 7/2008 |
| WO | WO2008067258 | 6/2008 |

OTHER PUBLICATIONS

Search and Examination Report from the UK Intellectual Property Office dated Apr. 4, 2013, Application No. GB1215471.2, 5 pages.
(Continued)

*Primary Examiner* — Matthew Gordon
(74) *Attorney, Agent, or Firm* — Artegis Law Group, LLP

(57) ABSTRACT

An IC system includes low-power chips, e.g., memory chips, located proximate one or more higher power chips, e.g., logic chips, without suffering the effects of overheating. The IC system may include a high-power chip disposed on a packaging substrate and a low-power chip embedded in the packaging substrate to form a stack. Because portions of the packaging substrate thermally insulate the low-power chip from the high-power chip, the low-power chip can be embedded in the IC system in close proximity to the high-power chip without being over heated by the high-power chip. Such close proximity between the low-power chip and the high-power chip advantageously shortens the path length of interconnects therebetween, which improves device performance and reduces interconnect parasitics in the IC system.

10 Claims, 5 Drawing Sheets

(51) Int. Cl.
*H01L 23/498* (2006.01)
*H01L 23/538* (2006.01)
*H01L 25/065* (2006.01)
*H01L 25/18* (2006.01)
*H01L 23/31* (2006.01)

(52) U.S. Cl.
CPC .......... *H01L 2224/2518* (2013.01); *H01L 2224/32225* (2013.01); *H01L 2224/73204* (2013.01); *H01L 2224/73253* (2013.01); *H01L 2225/06517* (2013.01); *H01L 2225/06541* (2013.01); *H01L 2225/1035* (2013.01); *H01L 2225/1041* (2013.01); *H01L 2225/1058* (2013.01); *H01L 2924/15311* (2013.01)

(56) References Cited

U.S. PATENT DOCUMENTS

| | | | |
|---|---|---|---|
| 2004/0056344 A1* | 3/2004 | Ogawa et al. | 257/686 |
| 2004/0075164 A1 | 4/2004 | Pu et al. | |
| 2004/0201085 A1 | 10/2004 | Ogawa et al. | |
| 2005/0133932 A1 | 6/2005 | Pohl et al. | |
| 2006/0145328 A1 | 7/2006 | Hsu | |
| 2006/0170098 A1 | 8/2006 | Hsu | |
| 2008/0157350 A1 | 7/2008 | Cheah et al. | |
| 2008/0246135 A1 | 10/2008 | Wong et al. | |
| 2009/0243065 A1* | 10/2009 | Sugino et al. | 257/686 |
| 2010/0127407 A1 | 5/2010 | LeBlanc et al. | |
| 2010/0148316 A1* | 6/2010 | Kim et al. | 257/621 |
| 2010/0237482 A1 | 9/2010 | Yang et al. | |
| 2010/0309704 A1* | 12/2010 | Dattaguru et al. | 365/51 |
| 2011/0317381 A1 | 12/2011 | Kim et al. | |
| 2012/0286413 A1* | 11/2012 | Meyer-Berg et al. | 257/698 |

OTHER PUBLICATIONS

Search and Examination Report from the UK Intellectual Property Office dated Dec. 19, 2012.

\* cited by examiner

SYSTEM WITH A HIGH POWER CHIP AND A LOW POWER CHIP HAVING LOW INTERCONNECT PARASITICS

BACKGROUND OF THE INVENTION

Field of the Invention

Embodiments of the present invention relate generally to integrated circuit chip packaging and, more specifically, to a system with a high power chip and a low power chip.

Description of the Related Art

In the packaging of integrated circuit (IC) chips, there is generally a trade-off between the thermal management of chips and other devices contained in a package and the performance of said devices. Specifically, by locating memory chips, passive devices, and other low-power components of an IC package as close as possible to the central processor unit (CPU) and other high-power devices in an IC package, communication between devices in the IC package is accelerated and packaging parasitics are reduced. However, heat generated by higher-power chips is known to adversely affect memory chips and other devices positioned nearby. Consequently, it is not thermally feasible to stack memory chips and passive devices directly on or under a CPU or other high-power chip when incorporated into a single IC package; such a configuration necessarily limits the power of the high-power chip or risks damage to and/or affects the performance of the memory chips. Including lower-power chips in a single IC package by positioning such chips beside the high-power chips in the IC package is also undesirable, since such a horizontally distributed configuration results in the IC package having an impractically large footprint as well as having a longer interconnect path between the low-power chips and the high-power chips. As the foregoing illustrates, there is a need in the art for an IC package for a high-power chip and a low-power chip disposed in close proximity to each other that prevents the low-power chip from overheating.

SUMMARY OF THE INVENTION

One embodiment of the present invention sets forth an IC system in which low-power chips, e.g., memory chips, are located proximate one or more higher power chips, e.g., logic chips, without suffering the effects of overheating. The IC system includes a low-power chip embedded in a packaging substrate and a high-power logic chip disposed on the packaging substrate to form a stack. Because portions of the packaging substrate thermally insulate the embedded low-power chip from the high-power chip, the low-power chip can be positioned proximate the high-power chip without being overheated.

One advantage of the present invention is that memory chips and other low-power devices can be positioned in close proximity to high-power devices in the same IC system without being overheated by the high-power devices. Such close proximity advantageously shortens the path length of interconnects between the high- and low-power devices, which improves device performance and reduces interconnect parasitics in the IC system.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

Figure 1:
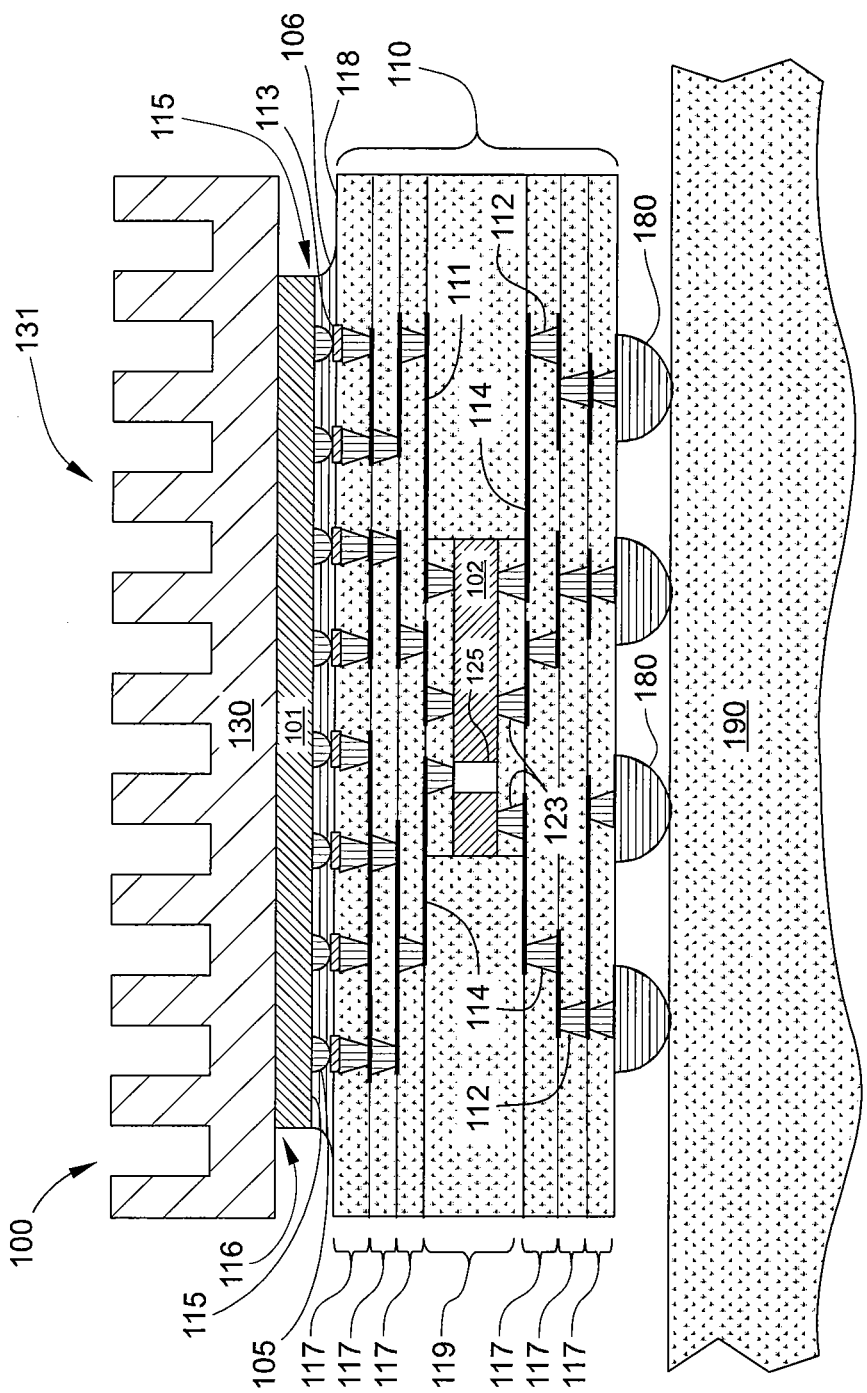
FIG. 1 is a schematic cross-sectional view of an integrated circuit (IC) system, according to one embodiment of the invention.

FIG. 1 is a schematic cross-sectional view of an integrated circuit (IC) system 100, according to one embodiment of the invention. IC system 100 includes multiple IC chips and/or other discrete microelectronic components, and is configured to electrically and mechanically connect said chips and components to a printed circuit board 190. IC system 100 includes a vertical combination, i.e., a stacked configuration, of a high-power chip 101 and a low-power chip 102, in which low-power chip 102 is thermally insulated from high-power chip 101 and therefore is not significantly affected by high-power chip 101.

IC system 100 includes high-power chip 101, low-power chip 102, a packaging substrate 110, and a plurality of packaging leads 180. High-power chip 101 is mounted on one side of packaging substrate 110 and low-power chip 102 is embedded in packaging substrate 110, so that low-power chip 102 is thermally insulated from high-power chip 101. Because portions of packaging substrate 110 act as a thermally insulating layer, low-power chip 102 can be positioned to overlap a significant portion of high-power chip 101 without being adversely affected by the heat generated by high-power chip 101. Packaging leads 180 provide electrical connections between IC system 100 and a printed circuit board (PCB) 190, and may be any technically feasible chip package electrical connection known in the art, including a ball-grid array (BGA), a pin-grid array (PGA), and the like.

High-power chip 101 is a high-power chip, such as a central processing unit (CPU), a graphics processing unit (GPU), application processor or other logic device, or any IC chip that generates enough heat during operation to adversely affect the performance of low-power chip 102 or passive devices located in IC system 100. A "high-power chip," as defined herein, is any IC chip that generates at least 10 W of heat or more during normal operation. High-power chip 101 is an unencapsulated die that is not contained in a chip carrier or package. High-power chip 101 is mounted on a surface 118 of packaging substrate 110 and is electrically connected to electrical connections on surface 118 of packaging substrate 110. The electrical connections between high-power chip 101 and packaging substrate 110 may be made using any technically feasible approach known in the art, including soldering of microbumps 105 disposed on surface 115 of high-power chip 101 to bond pads 113 formed on surface 118 of packaging substrate 110. Alternatively, such electrical connections are made by mechanically pressing a PGA on the high-power chip 101 into through-holes or sockets formed in packaging substrate 110. In the embodiment illustrated in FIG. 1, high-power chip 101 is configured with microbumps 105 that electrically and mechanically couple high-power chip 101 to packaging substrate 110. Underfill 106 (vertical cross-hatched), overmold, or any other technically feasible packaging techniques may be used to protect the electrical connections of high-power chip 101 to packaging substrate 110.

As shown, side 115 of high-power chip 101 is mounted against packaging substrate 110, and an opposite side 116 of high-power chip 101 faces away from packaging substrate 110 and is available for a heat sink or other cooling mechanism to be attached thereto. In the embodiment illustrated in FIG. 1, high-power chip 101 is thermally coupled to a cooling mechanism 130, which includes a heat spreader 131 to enhance the thermal transmittance of IC system 100.

Low-power chip 102 is low-power IC chip that does not generate enough heat during operation to adversely affect the performance of adjacent IC chips or devices. A "low-power chip," as defined herein, is any IC chip that generates on the order of about 1 W of heat, i.e., no more than about 5 W, during normal operation. Low-power chip 102 may be or passive devices located in IC system 100. a memory device, such as RAM, flash memory, etc., an I/O chip, or any other chip that does not generate over 5 W in normal operation. Low-power chip 102 and may be an unencapsulated, or "bare silicon" memory chip or, in a preferred embodiment, an encapsulated and tested memory chip that is a complete package. In the latter case, the package containing low-power chip 102 is a "low-profile" package that is thin enough to be embedded in packaging substrate 110. Low-power chip 102 is mounted opposite high-power chip 101 in a stacked configuration, and is electrically connected to PCB 190 and high-power chip 101 via conductive traces 114 formed in packaging substrate 110. The electrical connection between low-power chip 102 and packaging substrate 110 may be made using any technically feasible approach known in the art. In the embodiment illustrated in FIG. 1, such electrical connections between low-power chip 102 and the conductive traces 114 in packaging substrate 110 are made using copper-filled vias 123 that are formed during the process of building up packaging substrate 110 from a core 119.

In some embodiments, low-power chip 102 includes through-silicon vias (TSVs) 125 to facilitate electrical connections between low-power chip 102, high-power chip 101, and PCB 190. Specifically, TSVs 125 effectively provide very short electrical connections between the surface of low-power chip 102 facing PCB 190 and the surface of low-power chip 102 facing high-power chip 101. This is because the electrical connections disposed on low-power chip 102, such as bond pads and the like, are typically manufactured on a single side of low-power chip 102, while it is desirable for low-power chip 102 to make electrical connections to components on both sides, i.e., to packaging substrate 110 and to PCB 190. Thus, via TSVs 125, low-power chip 102 can be embedded in IC system 100 as shown in FIG. 1 and electrical connections can be made directly to both PCB 190 and to conductive traces 114 on packaging substrate 110, thereby forming very short path-length interconnects between low-power chip 102 and high-power chip 101. TSVs 125 are "micro vias" formed through low-power chip 102 and bumped with a conductive material such as solder for making electrical connections directly to low-power chip 102 via conductive traces 114.

Packaging substrate 110 provides IC system 100 with structural rigidity as well as an electrical interface for routing input and output signals and power between high-power chip 101, low-power chip 102, and printed circuit board 190. Packaging substrate 110 is a rigid and thermally insulating substrate on which high-power chip 101 is mounted and inside of which low-power chip 102 is embedded. In some embodiments, packaging substrate 110 is a laminate substrate and is composed of a stack of insulative layers 117 or laminates that are built up on the top and bottom surfaces of core 119. As shown, interconnect layers 111 and vias 112 are formed between the insulating laminate layers to produce conductive traces 114 between low-power chip 102 and PCB 110 and between low-power chip 102 and high-power chip 101. Prior to the formation of interconnect layers 111 and vias 112, a hole is formed in core 119 and low-power chip 102 is positioned therein. Vias 123 and the outer layers of packaging substrate 110, i.e., interconnect layers 111 and insulative layers 117, are then formed around low-power chip 102.

There are a number of suitable materials widely known in the art for manufacturing laminate substrates used in embodiments of the invention that posses the requisite mechanical strength, electrical properties, and desirably low thermal conductivity. Such materials include FR-2 and FR-4, which are traditional epoxy-based laminates, and the resin-based Bismaleimide-Triazine (BT) from Mitsubishi Gas and Chemical.

FR-2 is a synthetic resin bonded paper having a thermal conductivity in the range of about 0.2 W/(K-m). FR-4 is a woven fiberglass cloth with an epoxy resin binder that has a thermal conductivity in the range of about 0.35 W/(K-m). BT/epoxy laminate substrates also have a thermal conductivity in the range of about 0.35 W/(K-m). Other suitably rigid, electrically isolating, and thermally insulating materials that have a thermal conductivity of less than about 0.5 W/(K-m) may also be used and still fall within the scope of the invention.

In addition to serving as a structural base for IC system 100, packaging substrate 110 also routes power signals, ground signals, and input/output (I/O) signals to and from high-power chip 101, low-power chip 102, and PCB 190 via conductive traces 114. Thus, packaging substrate 110 is configured with metal conductors to perform this routing function, i.e., interconnect layers 111 and vias 112. In some embodiments, interconnect layers 111 are traces etched from copper foil bonded to one or more laminates of packaging substrate 110 and vias 112 are plated or finished with gold and/or a layer of electroless nickel.

Because portions of packaging substrate 110 is disposed between high-power chip 101 and low-power chip 102, low-power chip 102 can be positioned to partially or completely overlap high-power chip 101 without being overheated. Positioning low-power chip 102 to partially or completely overlap high-power chip 101 results in better electrical performance of high-power chip 101 and low-power chip 102, since the shorter routing of interconnects between circuits results in faster signal propagation and reduction in noise, cross-talk, and other parasitics. In electronic circuit design, parasitics are unintended electrical effects, including resistance, capacitance and inductance, caused by the electrical interaction of the various components and wiring structures of the circuit. In the field of IC packaging, parasitics are caused by the interconnection of a chip to external components, e.g., IC bond pads, bond wires, package leads, conductive traces, and the like. By stacking high-power chip 101 and low-power chip 102 in an overlapping configuration as illustrated in FIG. 1, the length of interconnects between high-power chip 101 and low-power chip 102 is minimized, and such parasitics are greatly reduced. Further, the overall "footprint" of IC system 100 is minimized by stacking high-power chip 101 and low-power chip 102 as shown, so that IC system 100 is advantageously smaller than an IC package in which high-power chip 101 and low-power chip 102 are positioned side-by-side on the same side of a packaging substrate.

Figure 2:
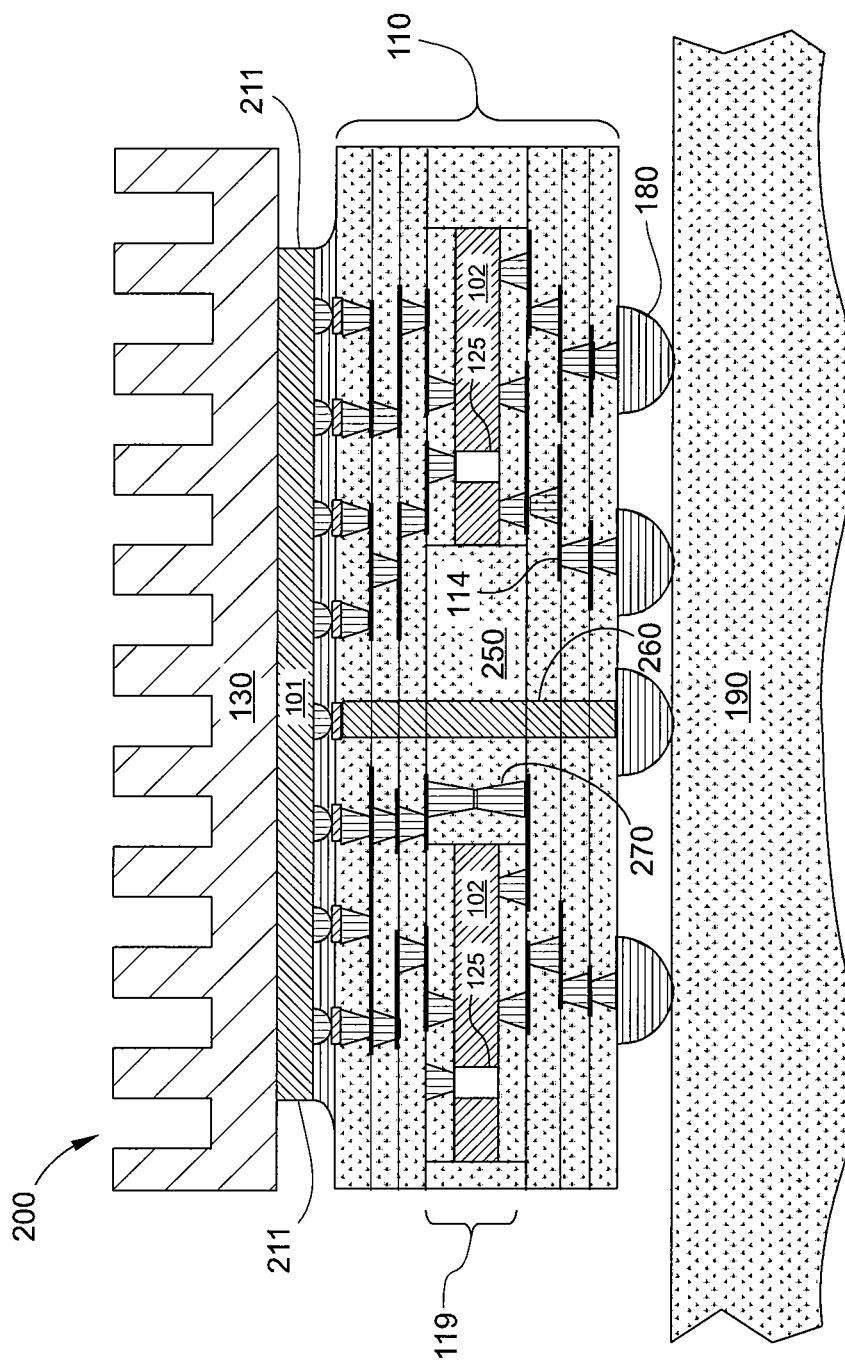
FIG. 2 is a schematic cross-sectional view of an IC system having multiple low-power chips partially overlapping a high-power chip, according to one embodiment of the invention.

In the embodiment illustrated in FIG. 1, high-power chip 101 and low-power chip 102 are positioned so that high-power chip 101 completely overlaps low-power chip 102, thereby forming a stack of chips. In other embodiments, the advantages of positioning low-power chip 102 and high-power chip 101 in close proximity are realized when low-power chip 102 only partially overlaps high-power chip 101. FIG. 2 is a schematic cross-sectional view of an IC system 200 having multiple low-power chips 102 partially overlapping high-power chip 101, according to one embodiment of the invention. As shown, in IC system 200, each of low-power chips 102 is offset from the center of high-power chip 101 and overlaps an edge 211 of high-power chip 101. Because each of low-power chips 102 is disposed proximate high-power chip 101 and is only separated therefrom by packaging substrate 110, the path length of interconnects between low-power chips 102 and high-power chip 101 is very short. Specifically, interconnects can be run directly through TSVs 125 of low-power chip 102 and conductive traces 114 of packaging substrate 110. It is noted that in a conventional PoP chip carrier, positioning one or more low-power chips 102 to be substantially overlapping with a high power logic device, such as a CPU or a GPU, is generally not thermally feasible, since the high power and significant heat generation of the logic device adversely affects the performance and reliability of low-power chip 102.

In one embodiment, low-power chips 102 are separated by a gap 250 or are offset from high-power chip 101 so that electrical interconnects 260 can be run directly to high-power chip 101 from PCB 190 and through packaging substrate 110. Electrical interconnects 260 may be used to provide power and/or ground signals to high-power chip 101. In another embodiment, I/O signal lines 270 are disposed in gap 250 and connect low-power chips 102 to high-power chip 101, either in lieu of or in addition to the use of TSVs 125 in low-power chips 102.

Figure 3:
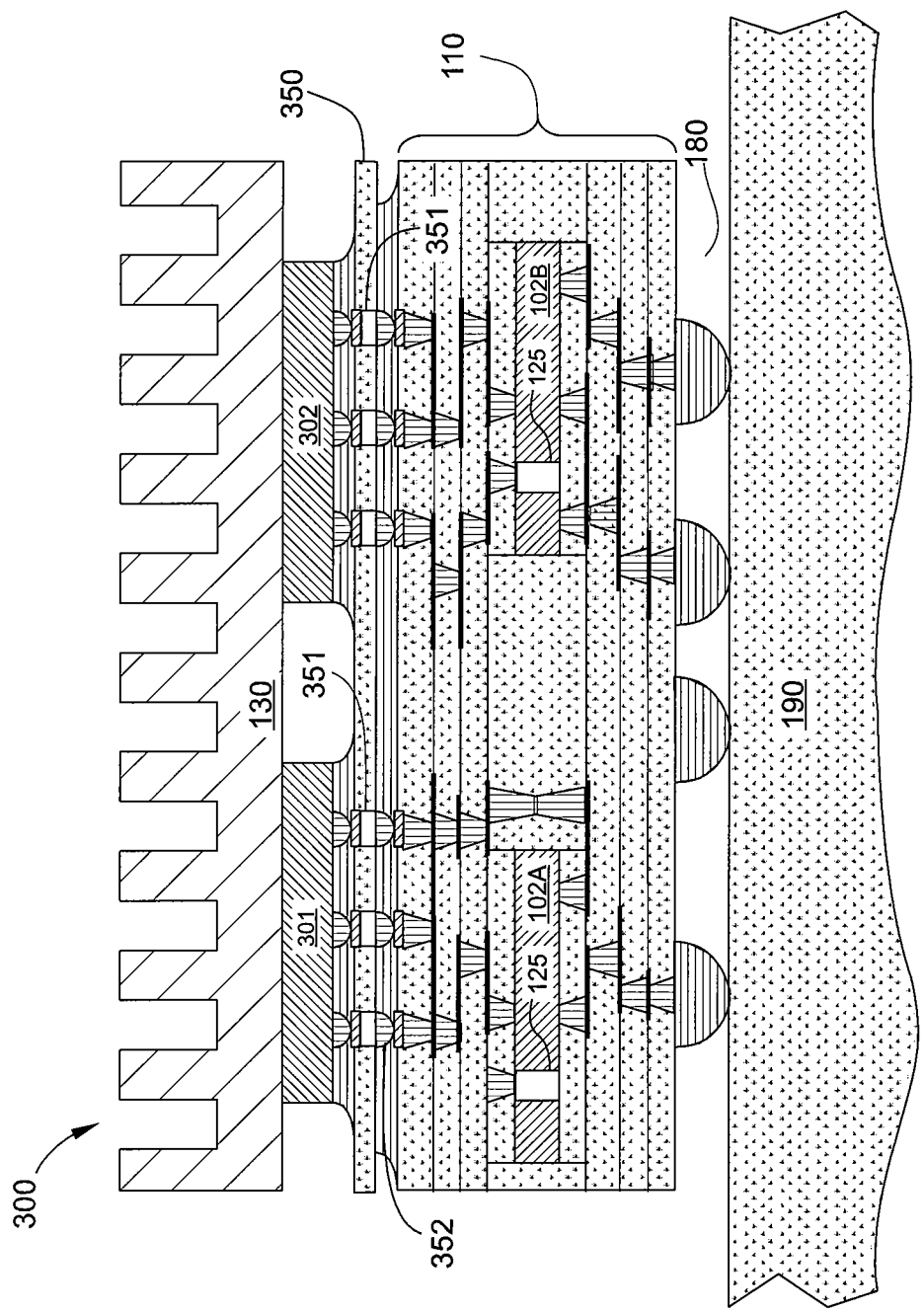
FIG. 3 is a schematic cross-sectional view of an IC package having multiple high-power chips, according to one embodiment of the invention.

According to some embodiments, an IC system includes two or more high-power logic chips. FIG. 3 is a schematic cross-sectional view of an IC system 300 having multiple high-power chips 301, 302, according to one embodiment of the invention. IC system 300 is substantially similar in organization and operation to IC system 100, except that IC system 300 includes two high-power logic chips 301, 302 and an interposer 350. Each of high-power chips 301, 302 may be a logic device, such as a CPU or a GPU, that generates enough heat during operation to adversely affect the performance of nearby low-power chips 102A, 102B and/or passive devices in IC system 300. Due to the significant thermal transmittance requirements of each of high-power logic chips 301, 302, high-power logic chips 301, 302 are not stacked. Instead, high-power logic chips 301, 302 are positioned in a side-by-side configuration, thereby facilitating the placement of cooling mechanism 130 directly thereon as shown. In some embodiments, low-power chip 102A is configured for use with high-power logic chip 301 and low-power chip 102B is configured for use with high-power logic chip 302. In some embodiments, IC system 300 may include one or more additional IC chips disposed on interposer 350 in addition to high-power chips 301, 302. For example, such additional IC chips may include one or more, global positioning system (GPS) chips, radio frequency (RF) transceiver chips, Wi-Fi chips, and the like.

High-power logic chips 301, 302 are coupled to interposer 350, which is an intermediate layer or structure that provides electrical interconnects between high-power logic chips 301, 302, low-power chips 102A, 102B, and PCB 190. In some embodiments, interposer 350 is formed from a silicon or glass substrate and is configured with multiple layers of metal interconnects and vias to provide said electrical connections. In some embodiments, interposer 350 includes through-silicon vias 351 that are similar in structure to TSVs 125 in low-power memory chips 102 depicted in FIG. 1. Through-silicon vias 351 provide very short electrical connections between high-power chip 101 and packaging substrate 110. Interposer 350 may be electrically and mechanically coupled to packaging substrate 110 with C4 solder bumps 352, deposited microbumps, or solder balls that are soldered to bond pads 113 on packaging substrate 110.

In the embodiment illustrated in FIG. 3, interposer 350 provides additional thermal insulation between high-power logic chips 301, 302 and low-power chips 102A, 102B. Thus, the use of interposer 350 facilitates high-speed propagation of signals between high-power logic chips 301 and 302 and enhances the thermal isolation of low-power chips 102A, 102B from high-power logic chips 301, 302.

Figure 4:
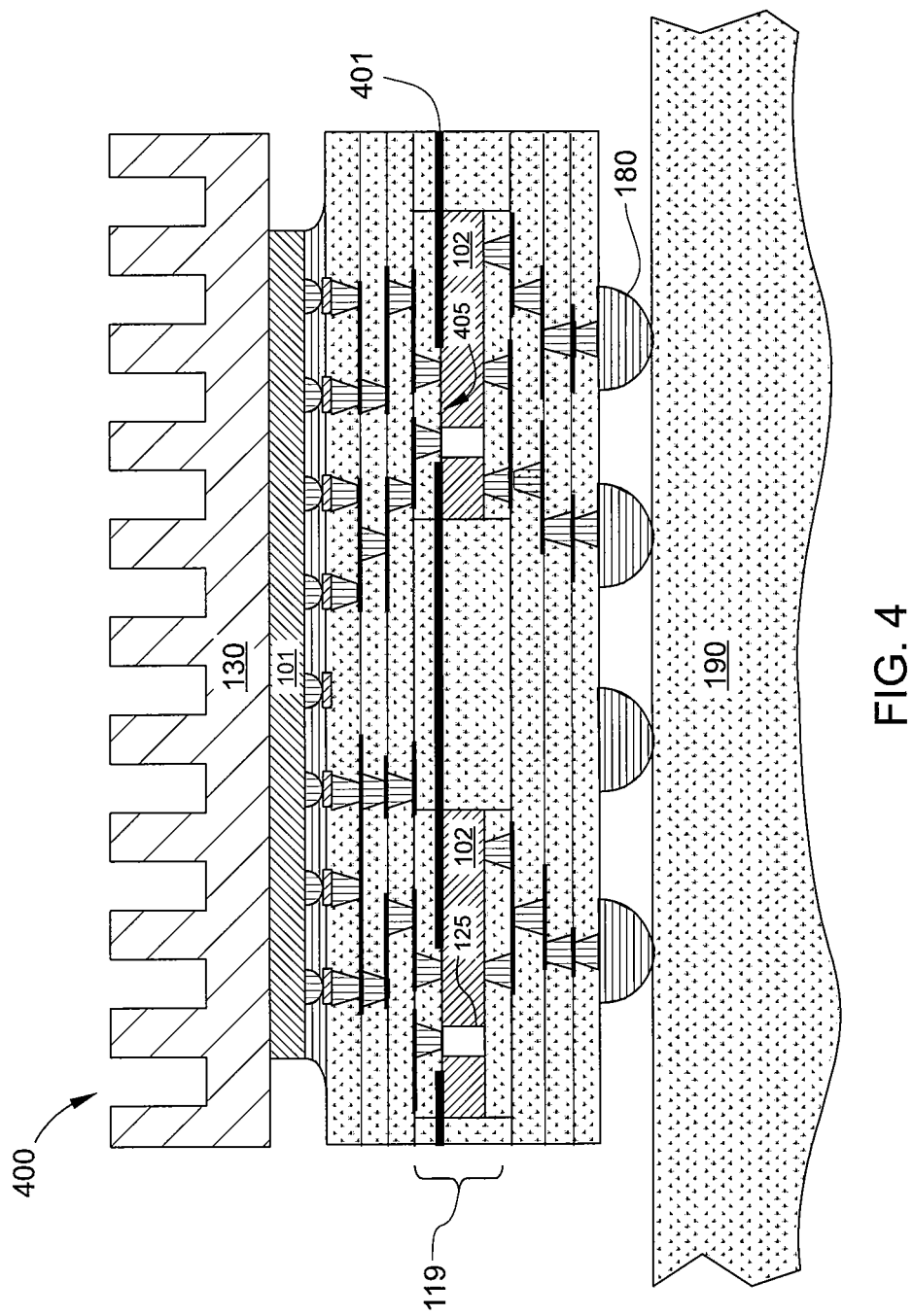
FIG. 4 is a schematic cross-sectional view of an IC package with a heat-distribution layer disposed adjacent to low-power chips, according to an embodiment of the invention.

According to some embodiments, an IC system includes a heat-distribution layer embedded in a packaging substrate and disposed adjacent to a low-power chip in the IC system to increase thermal transmittance from the low-power chip. FIG. 4 is a schematic cross-sectional view of an IC system 400 with a heat-distribution layer 401 embedded in a packaging substrate, according to an embodiment of the invention. As shown, heat-distribution layer 401 is formed as a layer of packaging substrate 410 and is positioned in contact with low-power chips 102. Heat-distribution layer 401, which is also referred to as a "heat pipe," includes a material having high thermal conductivity, such as copper or aluminum. Heat-distribution layer 401 is configured to conduct thermal energy generated by low-power chips 102 away from low-power chips 102, thereby reducing the risk of over-heating of low-power chips 102 during operation of IC system 400. In some embodiments, heat-distribution layer 401 is formed from one or more layers of metallic foil, the thickness of which can be readily determined by one of skill in the art given the footprint of IC system 400 and the heat generation of low-power chips 102 and high-power chip 101. In some embodiments, heat-distribution layer 401 includes through-holes 405 to allow interconnects to run between low-power chips 102 and high-power chip 101 without contacting heat-distribution layer 401. In some embodiments, one or more of low-power chips 102 may be disposed near an edge of IC system 400 to enhance heat removal from low-power chips 102.

Figure 5:
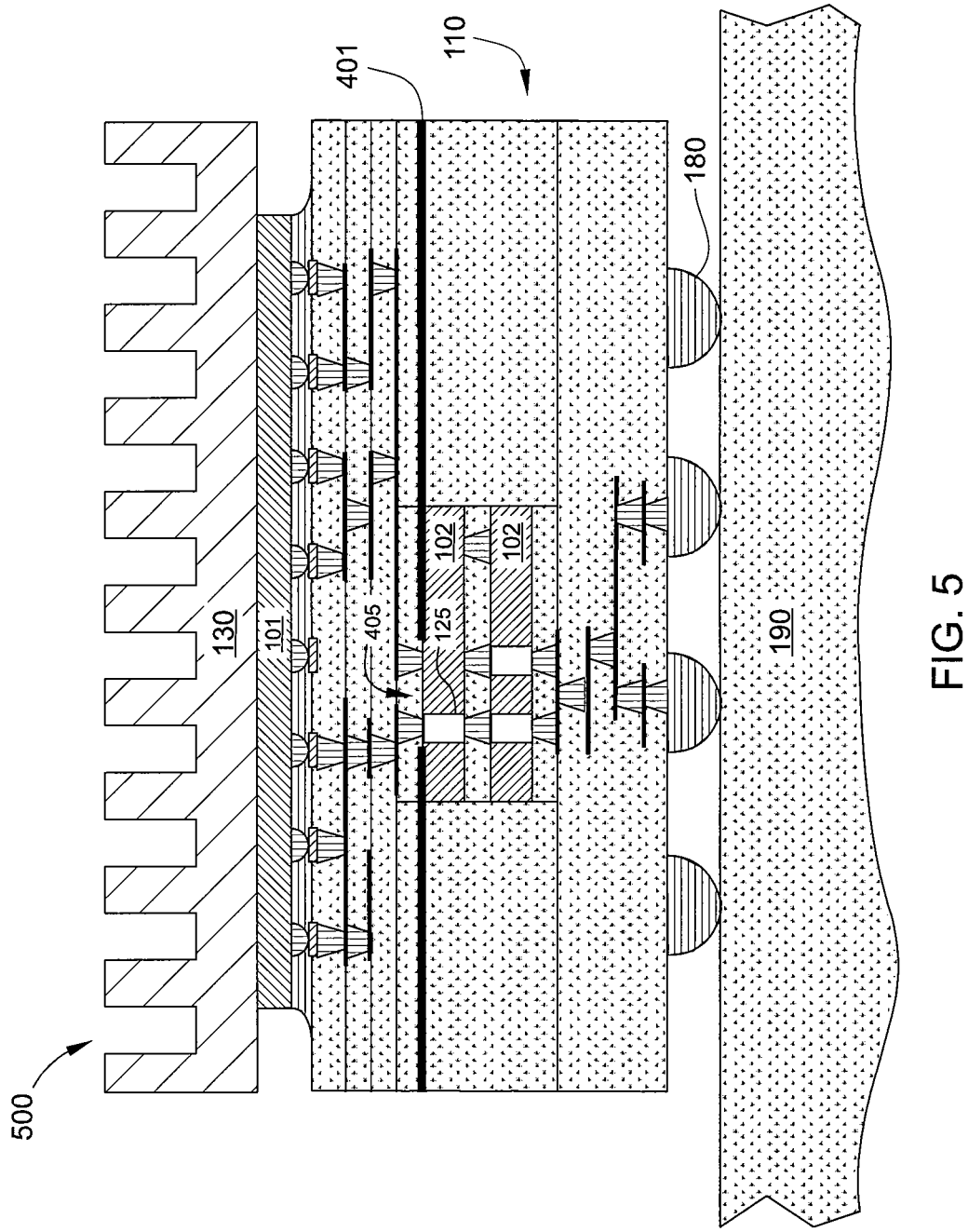
FIG. 5 is a schematic cross-sectional view of an IC package with a high-power chip disposed on one side of a packaging substrate and two low-power chips arranged in a stacked configuration and embedded in the packaging substrate, according to an embodiment of the invention.

In yet another embodiment of the invention, an IC system includes a stack of multiple memory chips that is positioned to substantially overlap a high-power logic chip, thereby reducing the footprint of the IC system when the IC system includes multiple memory chips. FIG. 5 is a schematic cross-sectional view of an IC system 500 with high-power chip 101 disposed on one side of packaging substrate 110 and two low-power chips 102 arranged in a stacked configuration and embedded in packaging substrate 110, according to an embodiment of the invention. Because low-power chips 102 are stacked as shown, multiple low-power chips 102 may be included in IC system 500 without increasing the footprint of IC system 500.

In such an embodiment, one or more heat-distribution layers 401 may be positioned in contact with one or more of low-power chips 102. In some embodiments, heat-distribution layers 401 may be disposed adjacent to and in contact with each of low-power chips 102 and/or between low-power chips 102. In some embodiments, heat-distribution layer 401 is formed as one the layers deposited or otherwise attached to core 119 during the process of building up packaging substrate 110. Heat-distribution layer 401 includes through-holes 405 that allow interconnects to run between low-power chips 102 and packaging substrate 110. TSVs 125, as described above in conjunction with FIG. 1, provide interconnects between low-power chips 102 and high-power chip 101 that have very short path length, thereby minimizing interconnect parasitics and maximizing signal propagation in IC system 500. Further, low-power chips 102 are not subject to overheating in IC system 500, first, because packaging substrate 110 provides substantial thermal insulation of low-power chips 102 from high-power chip 101, and second, because heat-distribution layers 401 increase thermal transmittance from low-power chips 102 to remove heat generated by low-power chips 102.

In sum, embodiments of the invention set forth an IC system in which low-power chips are located proximate one or more high power chips in the same IC system without suffering the effects of overheating. In addition, such close proximity advantageously shortens the path length of interconnects between the high- and low-power devices, which improves device performance and reduces interconnect parasitics in the IC system.

While the foregoing is directed to embodiments of the present invention, other and further embodiments of the invention may be devised without departing from the basic scope thereof, and the scope thereof is determined by the claims that follow.

We claim:
1. A system, comprising:
a first high-power chip disposed on a first side of a chip-packaging substrate;
a first thermally insulating layer and a second thermally insulating layer;
a first low-power chip embedded in the chip-packaging substrate between the first thermally insulating layer and the second thermally insulating layer and electrically connected to the first high-power chip, and
a heat-distribution layer that includes one or more layers of metallic foil and is embedded in the chip-packaging substrate between the first thermally insulating layer and the second thermally insulating layer and adjacent to the first low-power chip, wherein the heat-distribution layer extends from a first edge of the chip-packaging substrate to a second edge of the chip packaging substrate and does not substantially vary in depth,
wherein the high-power chip generates at least 10 W of heat and the low-power chip generates less than 5 W of heat.
2. The system of claim 1, wherein the first low-power chip is electrically connected to the first high-power chip by a through-silicon via formed in the first low-power chip.
3. The system of claim 1, wherein at least one of the first thermally insulating layer and the second thermally insulating layer comprises a thermally insulating material having a thermal conductivity of less than about 0.5 W/(° C.-m).
4. The system of claim 1, wherein the first low-power chip comprises a memory chip.
5. The system of claim 1, wherein the first low-power chip is disposed between the first high-power chip and a plurality of electrical leads that are configured to electrically connect the system to a printed circuit board.
6. The system of claim 1, further comprising a second low-power chip that is embedded in the chip-packaging substrate.
7. The system of claim 1, wherein the heat-distribution layer is positioned between the first high-power chip and the first low-power chip.
8. The system of claim 2, wherein the heat-distribution layer includes a plurality of through-holes, and the through-silicon via passes through one of the plurality of through-holes.
9. The system of claim 1, wherein the heat-distribution layer is disposed between the first low-power chip and the first thermally insulating layer.
10. The system of claim 9, wherein the second thermally insulating layer is disposed between the first low-power chip and a second low-power chip.

* * * * *